(12) United States Patent
Wang et al.

(10) Patent No.: US 11,283,457 B2
(45) Date of Patent: Mar. 22, 2022

(54) WAVEFORM GENERATOR AND WAVEFORM GENERATING METHOD

(71) Applicant: Nuvoton Technology Corporation, Hsinchu Science Park (TW)

(72) Inventors: Cheng-Chih Wang, Jhubei (TW); Chih-Ping Lu, Hsinchu (TW)

(73) Assignee: Nuvoton Technology Corporation, Hsinchu Science Park (TW)

( * ) Notice: Subject to any disclaimer, the term of this patent is extended or adjusted under 35 U.S.C. 154(b) by 0 days.

(21) Appl. No.: 17/134,835

(22) Filed: Dec. 28, 2020

(65) Prior Publication Data
US 2021/0203335 A1 Jul. 1, 2021

(30) Foreign Application Priority Data

Dec. 30, 2019 (TW) .................................. 108148300

(51) Int. Cl.
*H03M 1/66* (2006.01)
*H03M 1/00* (2006.01)
*H03K 4/04* (2006.01)

(52) U.S. Cl.
CPC .............. *H03M 1/002* (2013.01); *H03K 4/04* (2013.01)

(58) Field of Classification Search
CPC .... H03M 1/66; H03M 1/1038; H03M 1/1085; H03M 1/002; H03M 1/06; H03M 1/0624; H03M 1/08; H03M 1/0836; H03M 1/0863; H03M 1/10; H03M 1/1047; H03M 1/108; H03M 1/661; H03M 1/662; H03M 1/742; H03M 1/765; H03M 1/822; H03M 3/04; H03M 3/432; H03M 3/464

USPC .......................... 341/144, 121, 139, 140, 142
See application file for complete search history.

(56) References Cited

U.S. PATENT DOCUMENTS

| | | | | |
|---|---|---|---|---|
| 6,252,676 | B1 * | 6/2001 | Azima | .................... B41B 21/32 358/1.9 |
| 6,563,448 | B1 * | 5/2003 | Fontaine | ............ H03H 17/0642 341/143 |
| 6,825,785 | B1 * | 11/2004 | Huang | .................... H03L 7/093 341/141 |
| 6,950,050 | B1 * | 9/2005 | Jordan | .................. H03M 1/661 341/131 |
| 7,443,323 | B2 * | 10/2008 | Rotchford | ........... H03M 1/1047 341/118 |

(Continued)

*Primary Examiner* — Linh V Nguyen

(74) *Attorney, Agent, or Firm* — Muncy, Geissler, Olds & Lowe, P.C.

(57) ABSTRACT

A waveform generator is provided. The waveform generator includes a timer and a digital to analog converter (DAC). The timer periodically provides a trigger signal according to a fixed time period. In response to the trigger signal, the DAC is configured to convert first digital data into output voltage of an analog signal. A data hold register is configured to store second digital data that corresponds to the previous output voltage of the analog signal. A judgment circuit is configured to provide a first control signal according to the second digital data, and the first control signal indicates that the previous output voltage is within a first voltage range. A calculation circuit is configured to obtain the first digital data according to the second control signal, the second digital data, and a voltage variation that corresponds to the first voltage range and to update the second digital data.

20 Claims, 5 Drawing Sheets

(56) References Cited

U.S. PATENT DOCUMENTS

| | | | | |
|---|---|---|---|---|
| 7,773,011 | B2* | 8/2010 | Sahu | H03M 1/108 |
| | | | | 341/120 |
| 8,643,525 | B1* | 2/2014 | Wen | H03M 1/067 |
| | | | | 341/144 |
| 9,397,676 | B1* | 7/2016 | Nguyen | H03M 1/002 |
| 2005/0165567 | A1* | 7/2005 | Inatsune | H03M 1/1038 |
| | | | | 702/66 |
| 2006/0145902 | A1* | 7/2006 | Tucholski | H03M 1/66 |
| | | | | 341/144 |
| 2010/0283651 | A1* | 11/2010 | Dura | H03M 1/667 |
| | | | | 341/150 |
| 2012/0146828 | A1* | 6/2012 | Narathong | H03B 5/1265 |
| | | | | 341/154 |

* cited by examiner

WAVEFORM GENERATOR AND WAVEFORM GENERATING METHOD

CROSS REFERENCE TO RELATED APPLICATIONS

This application claims priority of Taiwan Patent Application No. 108148300, filed on Dec. 30, 2019, the entirety of which is incorporated by reference herein.

BACKGROUND OF THE INVENTION

Field of the Invention

The invention relates to a waveform generator, and more particularly to a waveform generator with a digital to analog converter (DAC).

Description of the Related Art

Nowadays, digital to analog converter (DAC) has been widely used in the data conversion of electronic devices, which mainly converts digital signals into corresponding analog signals. Therefore, by controlling the change of the digital signal, arbitrary waveforms can be generated.

In a low-power microcontroller system, in order to achieve the best power consumption and performance, the peripheral devices are usually used directly to enable another device without through the processor, for example, direct memory access (DMA) technology can be used. FIG. 1 shows a conventional waveform generator 100. The waveform generator 100 includes a timer 110, a digital-to-analog converter (DAC) 120, and a direct memory access (DMA) device 130. In the waveform generator 100, the waveform data DAT is stored in the memory of the DMA device 130 in advance. Then, the timer 110 periodically provides a trigger signal TG at a fixed time to trigger the DAC 120. After receiving the trigger signal TG, the DAC 120 provides a requirement signal Req to the DMA device 130, so as to obtain the waveform data DAT from the DMA device 130. Thus, the DAC 120 can generate the output voltage of the analog signal Sout according to the waveform data DAT. However, by generating the analog signal Sout with the waveform generator 100, a memory is required to store a large amount of waveform data DAT in advance, which will occupy the storage space of the memory. In addition, using DMA technology to transmit the waveform data DAT to the DAC 120 will also increase power consumption.

Therefore, it is desired a waveform generator for saving memory space and reducing power consumption.

BRIEF SUMMARY OF THE INVENTION

Waveform generators and waveform generating method are provided. An embodiment of a waveform generator is provided. The waveform generator includes a timer and a digital to analog converter (DAC). The timer is configured to periodically provide a trigger signal according to a fixed time period. The DCA is configured to convert first digital data into the output voltage of an analog signal in response to the trigger signal. The analog signal has a fixed waveform and a fixed frequency between the maximum voltage and the minimum voltage, and the range between the maximum voltage and the minimum voltage is divided into a plurality of voltage ranges. The DAC includes a data hold register, a judgment circuit and a calculation circuit. The data hold register is configured to store the second digital data that corresponds to the previous output voltage of the analog signal. The judgment circuit is configured to provide a first control signal according to the second digital data, and the first control signal indicates that the previous output voltage is within a first voltage range. The calculation circuit is configured to obtain the first digital data according to the second control signal, the second digital data, and a voltage variation that corresponds to the first voltage range, and to store the first digital data in the data hold register to update the second digital data. The second control signal indicates whether the analog signal has a rising waveform or a falling waveform.

Furthermore, an embodiment of a waveform generator is provided. The waveform generator includes a timer and a digital to analog converter (DAC). The timer is configured to provide a trigger signal according to a variable time period. The DAC is configured to convert first digital data into the output voltage of an analog signal in response to the trigger signal. The analog signal has a fixed waveform and a fixed frequency between the maximum voltage and the minimum voltage, and the range between the maximum voltage and the minimum voltage is divided into a plurality of voltage ranges. The DAC includes a data hold register, a judgment circuit and a calculation circuit. The data hold register is configured to store the second digital data. The judgment circuit is configured to provide a first control signal according to the previous output voltage of the analog signal that corresponds to the second digital data, and the first control signal indicates that the previous output voltage is within a first voltage range. The calculation circuit is configured to obtain the first digital data according to the second control signal, the second digital data, and a fixed voltage variation, and store the first digital data in the data hold register to update the second digital data. The second control signal indicates whether the analog signal has a rising waveform or a falling waveform.

Moreover, an embodiment of a waveform generating method is provided. A trigger signal is periodically provided according to a fixed time period. In response to the trigger signal, first digital data is converted into the output voltage of an analog signal. The analog signal has a fixed waveform and a fixed frequency between the maximum voltage and the minimum voltage, and the range between the maximum voltage and the minimum voltage is divided into a plurality of voltage ranges. A first control signal is provided according to the previous output voltage of the analog signal that corresponds to the second digital data. The first control signal indicates that the previous output voltage is within a first voltage range. The first digital data is obtained according to the second control signal, the second digital data, and a voltage variation that corresponds to the first voltage range. The second digital data is updated according to the first digital data. The second control signal indicates whether the analog signal has a rising waveform or a falling waveform.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
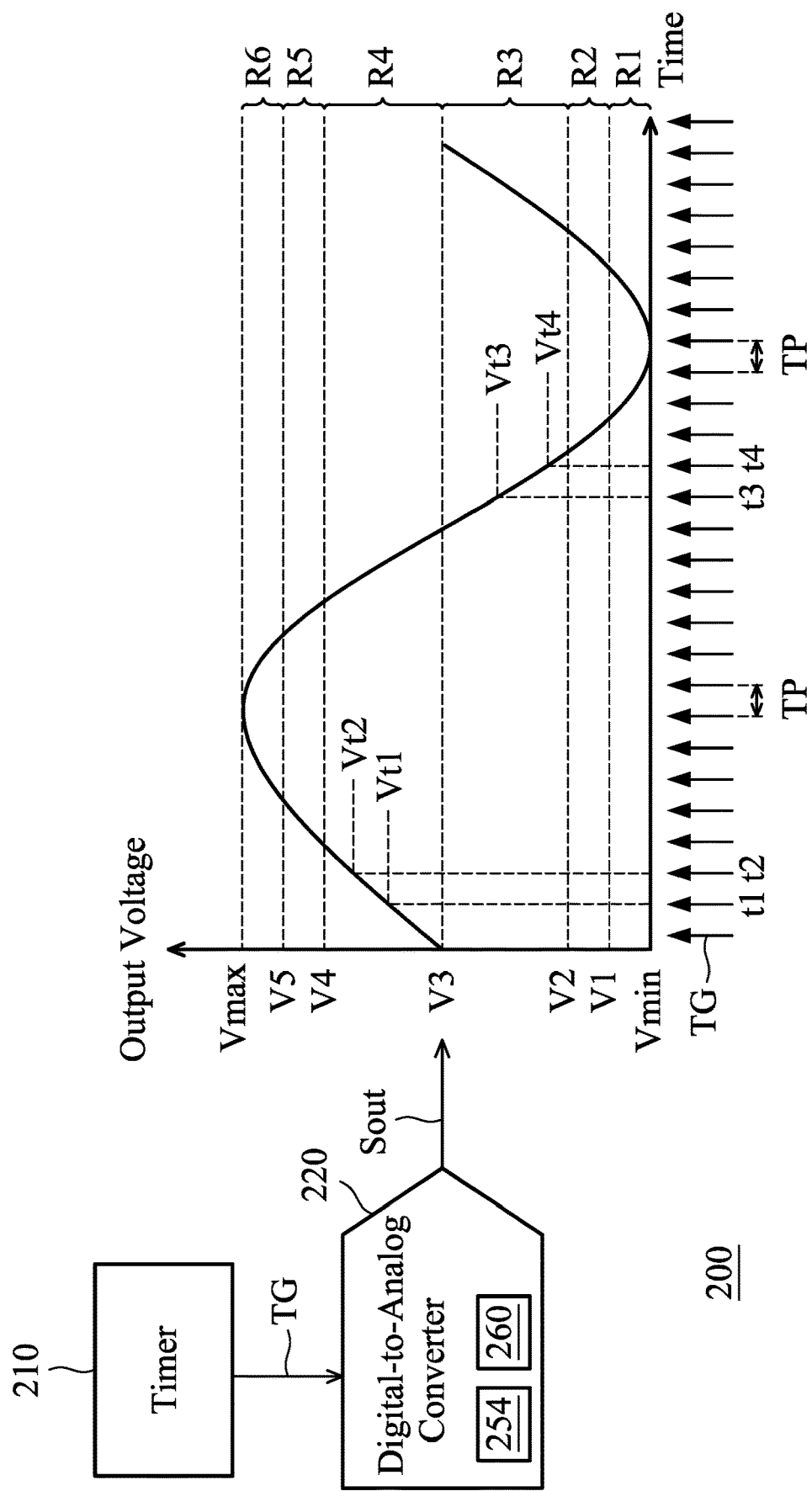
FIG. 2 shows a waveform generator according to some embodiment of the invention.

FIG. 2 shows a waveform generator 200 according to some embodiment of the invention. The waveform generator 200 includes a timer 210 and a digital-to-analog converter (DAC) 220. The DAC 220 includes a data hold register (DHR) 254 and a storage 260 for storing a voltage variation ΔN. The timer 210 is configured to periodically provide a trigger signal TG to the DAC 220 according to a fixed time period TP. In response to the trigger signal TG, the DAC 220 is configured to read the digital data DHR(t) from the data hold register 254, and to convert the digital data DHR(t) into an output voltage of an analog signal Sout. In some embodiments, the data hold register 254 may be a storage, a memory, or a general register. In addition, the digital data DHR(t) is obtained based on the digital data DHR(t−1) and the voltage variation ΔN provided by the storage 260. The digital data DHR(t) represents the current digital data DHR, and the digital data DHR(t−1) represents the previous digital data DHR. Moreover, the voltage variation ΔN represents the digital variation between the digital data DHR(t) and the digital data DHR(t−1).

In FIG. 2, the analog signal Sout is a sine wave signal. In general, a sine wave signal is a periodic and continuous waveform. For the convenience of description, only one period of sine wave is shown in FIG. 2. The output voltage of the analog signal Sout has a fixed waveform and a fixed frequency between the maximum voltage Vmax and the minimum voltage Vmin. In some embodiments, the maximum voltage Vmax is a power supply voltage (e.g., VDD), and the minimum voltage Vmin is a ground voltage (e.g., VSS). The frequency of the analog signal Sout is determined by the fixed time period TP, and the slope of the analog signal Sout is determined by the voltage variation ΔN. In the embodiment, the range from the minimum voltage Vmin to the maximum voltage Vmax is divided into 6 voltage ranges R1 through R6. For example, the voltage range R1 is between the minimum voltage Vmin and a voltage V1, the voltage range R2 is between the voltage V1 and a voltage V2, the voltage range R3 is between the voltage V2 and a voltage V3, the voltage range R4 is between the voltage V3 and a voltage V4, the voltage range R5 is between the voltage V4 and a voltage V5, and the voltage range R6 is between the voltage V5 and the maximum voltage Vmax. The size and quantity of the voltage range R1 through R6 are determined according to actual applications (e.g., the characteristics of the analog signal Sout). In addition, in each of voltage ranges R1 through R6, the output voltage of the analog signal Sout increases or decreases according to the corresponding voltage variation ΔN. For example, in the voltage range R1, the output voltage of the analog signal Sout rises or falls with the voltage variation ΔN1. Furthermore, in the voltage range R2, the output voltage of the analog signal Sout rises or falls with the voltage variation ΔN2, and so on.

In FIG. 2, the voltage V3 is an intermediate voltage between the maximum voltage Vmax and the minimum voltage Vmin, and the voltage range R3 and the voltage range R4 include the voltage V3. In addition, the size of the voltage range R3 (i.e., the voltage difference between the voltage V3 and the voltage V2) and the size of the voltage range R4 (i.e., the voltage difference between the voltage V4 and the voltage V3) are the same and larger than the voltage ranges R1, R2, R5 and R6. Moreover, the size of the voltage range R1 is the same as that of the voltage range R6, and the voltage variation ΔN1 that corresponds to the voltage range R1 is equal to the voltage variation ΔN6 that corresponds to the voltage range R6. Furthermore, the size of the voltage range R2 is the same as that of the voltage range R5, and the voltage variation ΔN2 that corresponds to the voltage range R2 is equal to the voltage variation ΔN5 that corresponds to the voltage range R5. In some embodiments, the voltage variation ΔN3 and voltage variation ΔN4 are the maximum variation, and the voltage variation ΔN1 and voltage variation ΔN6 are the minimum variation. In some embodiments, two adjacent voltage ranges correspond to different voltage variations ΔN. For example, the voltage range R2 is adjacent to the voltage range R3, and the voltage variation ΔN2 that corresponds to the voltage range R2 is different from the voltage variation ΔN3 that corresponds to the voltage range R3.

In the waveform generator 200, when the timer 210 is configured to provide the trigger signal TG to the DAC 220, the DAC 220 obtains the corresponding voltage variation ΔN according to the voltage region that corresponds to the output voltage of the analog signal S out, such as the voltage ranges R1 through R6. Next, in response to the rising waveform or the falling waveform of the analog signal Sout, the DAC 220 is configured to perform the addition or subtraction operation on the digital data DHR(t−1) according to the voltage variation ΔN, to obtain the digital data DHR(t). Taking the rising waveform of the analog signal Sout as an example, at time t1 and time t2, the timer 210 is configured to provide the trigger signal TG to the DAC 220 respectively. At time t1, the DAC 220 is configured to generate the analog signal Sout having an output voltage Vt1 in response to the trigger signal TG. The output voltage Vt1 corresponds to the digital data DHR(t1) and the output voltage Vt1 is within the voltage range R4. Next, at time t2, the DAC 220 is configured to generate the analog signal Sout having an output voltage Vt2 in response to the trigger signal TG, and the output voltage Vt2 corresponds to the digital data DHR(t2), which is obtained by the following formula DHR(t2):

$$DHR(t2)=DHR(t1)+\Delta N4$$

Thus, the analog signal Sout rises from the voltage Vt1 to the voltage Vt2 in the voltage range R4. In addition, taking the falling waveform of the analog signal Sout as an example, at time t3 and time t4, the timer 210 is configured to provide the trigger signal TG to the DAC 220, respectively. At time t3, the DAC 220 is configured to generate the analog signal Sout having an output voltage Vt3 in response to the trigger signal TG. The output voltage Vt3 corresponds to the digital data DHR(t3) and is within the voltage range R3. Next, at time t4, the DAC 220 is configured to generate the analog signal Sout having an output voltage Vt4 in response to the trigger signal TG, and the output voltage Vt4 corresponds to the digital data DHR(t4), which is obtained by the following formula DHR(t4):

$$DHR(t4)=DHR(t3)-\Delta N3$$

Thus, the analog signal Sout falls from the voltage Vt3 to the voltage Vt4 in the voltage range R3.

Figure 1:
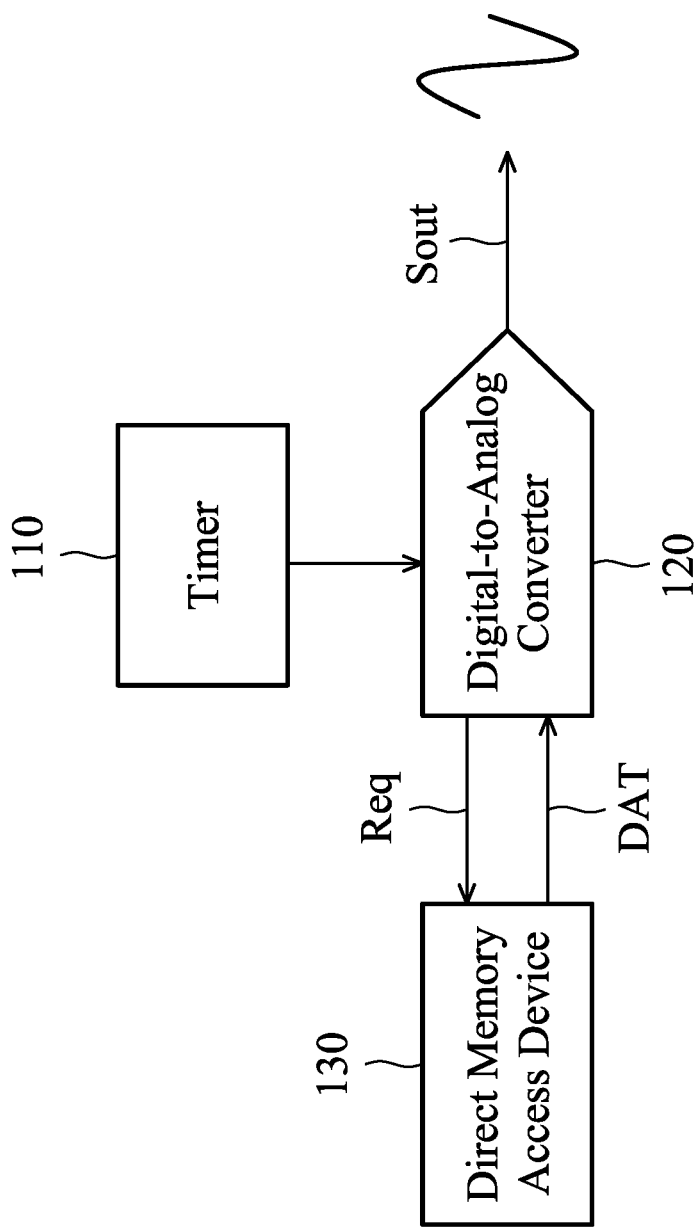
FIG. 1 shows a conventional waveform generator.

Compared with the waveform generator 100 in FIG. 1 or the waveform generator that can only generate the triangle waves, the waveform generator 200 does not need to read the waveform data DAT from the memory through the direct memory access (DMA) technology. Thus, in the electronic system with the waveform generator 200, the bandwidth of the DMA transmission is not occupied in the process of generating the analog signal Sout, thereby decreasing the power consumption.

Figure 3:
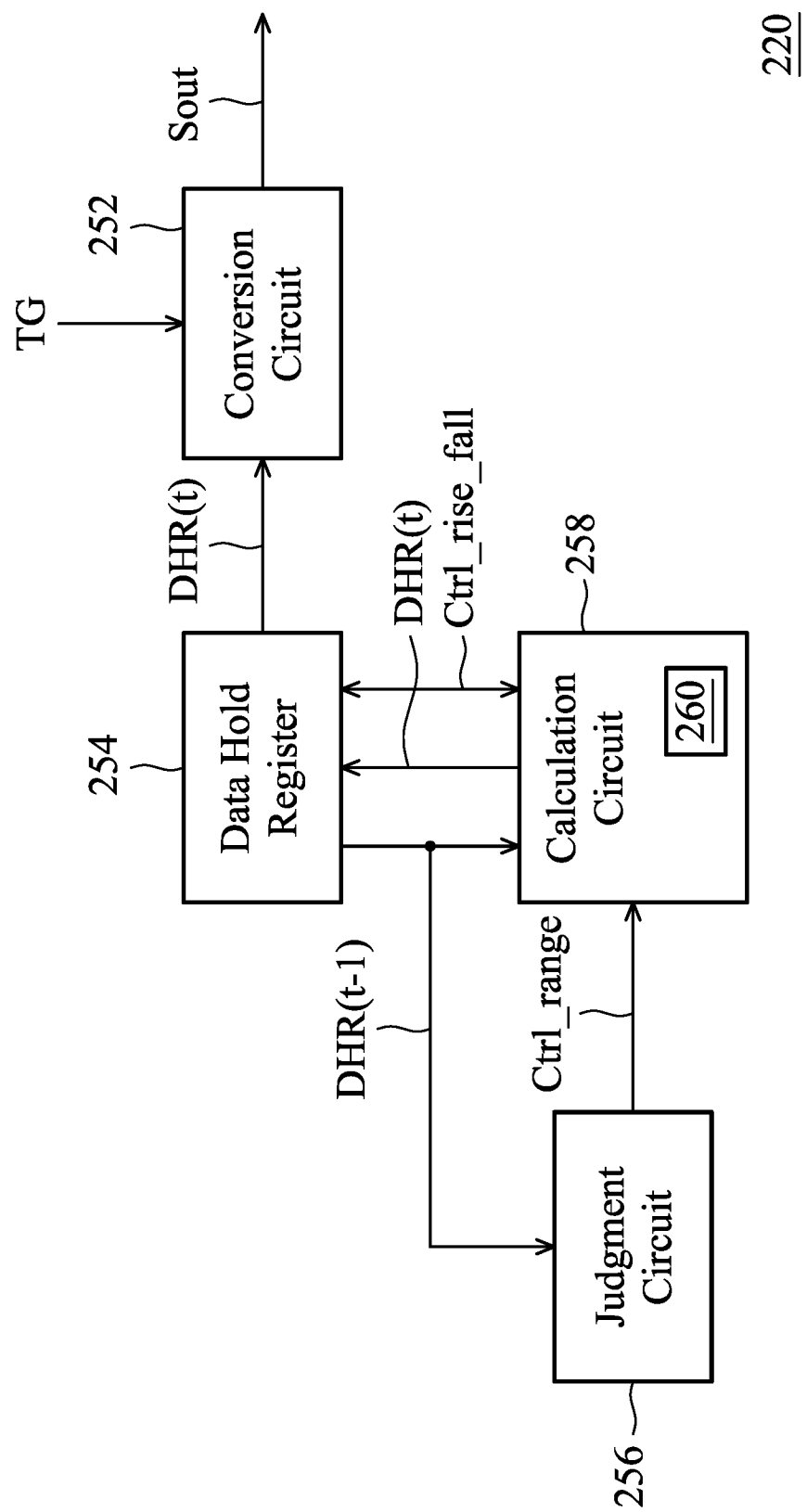
FIG. 3 shows the DAC according to some embodiments of the invention.

FIG. 3 shows the DAC 220 according to some embodiments of the invention. The DAC 220 includes a conversion circuit 252, the data hold register 254, a judgment circuit 256, and a calculation circuit 258. The data hold register 254 is configured to provide the digital data DHR(t−1) to the judgment circuit 256. As described describe, the digital data DHR(t−1) represents the previous digital data DHR. Next, the judgment circuit 256 is configured to provide the control signal Ctrl_range to the calculation circuit 258 according to the digital data DHR(t−1). The control signal Ctrl_range indicates in which voltage range the output voltage of the analog signal Sout that corresponds to the digital data DHR(t−1) is located, i.e., the voltage range R1, R2, R3, R4, R5 or R6. Next, the calculation circuit 258 is configured to obtain the digital data DHR(t) according to the control signal Ctrl_range and the digital data DHR(t−1) and the control signal Ctrl_rise_fall from the data hold register 254, and stores the digital data DHR(t) into the data hold register 254. The control signal Ctrl_rise_fall indicates whether the analog signal Sout has a rising waveform or a falling waveform. Therefore, in the data hold register 254, the digital data DHR(t−1) is updated to the digital data DHR(t). Next, in response to the trigger signal TG, the conversion circuit 252 is configured to convert the digital data DHR(t) from the data hold register 254 into the output voltage of the analog signal Sout. The conversion circuit 252 may be a resistive digital-to-analog conversion circuit, a capacitive digital-to-analog conversion circuit, or a current-type digital-to-analog conversion circuit. In some embodiments, the data hold register 254, the judgment circuit 256, and the calculation circuit 258 are integrated in the same circuit, such as a controller.

In the calculation circuit 258, the storage 260 is configured to store the voltage variation ΔN that corresponds to each voltage range. For example, the voltage variations ΔN1, ΔN2, ΔN3, ΔN4, ΔN5, and ΔN6 respectively that corresponds to the voltage ranges R1, R2, R3, R4, R5, and R6 are stored in the storage 260. Therefore, the calculation circuit 258 is configured to obtain the corresponding voltage variation ΔN from the storage 260 according to the control signal Ctrl_range. As described above, the voltage variations ΔN1 through ΔN6 and the voltage ranges R1 through R6 are determined according to the waveform characteristics of the analog signal Sout. In addition, the voltage variations ΔN1 through ΔN6 and the voltage ranges R1 through R6 can be modified through programming. Then, according to the control signal Ctrl_rise_fall, the calculation circuit 258 is configured to perform the addition or subtraction operation on the digital data DHR(t−1) according to the voltage variation ΔN from the storage 260. For example, when the control signal Ctrl_range indicates that the output voltage of the analog signal Sout that corresponds to the digital data DHR(t−1) is within (or located in) the voltage range R2, the calculation circuit 258 is configured to obtain the voltage variation ΔN2 that corresponds to the voltage range R2 from the storage 260. When the control signal Ctrl_rise_fall indicates that the analog signal Sout has a rising waveform, the calculation circuit 258 is configured to add the voltage variation ΔN2 to the digital data DHR(t−1) to obtain the digital data DHR(t). Conversely, when the control signal Ctrl_rise_fall indicates that the analog signal Sout has a falling waveform, the calculation circuit 258 subtracts the voltage variation ΔN2 from the digital data DHR(t−1) to obtain the digital data DHR(t). In some embodiments, the storage 260 is integrated in the data hold register 254.

After obtaining the digital data DHR(t), the calculation circuit 258 is configured to determine whether the digital data DHR(t) is greater than the maximum digital data DHRmax or less than the minimum digital data DHRmin. The maximum digital data DHRmax corresponds to the maximum voltage Vmax, and the minimum digital data DHRmin corresponds to the minimum voltage Vmin. When the digital data DHR(t) is greater than the maximum digital data DHRmax or less than the minimum digital data DHRmin, the calculation circuit 258 is configured to change the state of the control signal Ctrl_rise_fall, and stores the changed state of the control signal Ctrl_rise_fall into the data hold register 254. For example, when the control signal Ctrl_rise_fall with a high logic level indicates that the analog signal Sout has a rising waveform and the digital data DHR(t) is greater than the maximum digital data DHRmax, the calculation circuit 258 is configured to change the control signal Ctrl_rise_fall from the high logic level to the low logic level, to indicate that the analog signal Sout has a falling waveform, and to store the changed control signal Ctrl_rise_fall in the data hold register 254. Next, according to the changed control signal Ctrl_rise_fall, the calculation circuit 258 is configured to subtract the voltage variation ΔN2 from the digital data DHR(t−1), so as to retrieve the digital data DHR(t). Furthermore, when the control signal Ctrl_rise_fall with a low logic level indicates that the analog signal Sout has a falling waveform and the digital data DHR(t) is less than the minimum digital data DHRmin, the calculation circuit 258 is configured to change the control signal Ctrl_rise_fall from the low logic level to the high logic level, to indicate that the analog signal Sout has a rising waveform, and to store the changed control signal Ctrl_rise_fall in the data hold register 254. Next, according to the changed control signal Ctrl_rise_fall, the calculation circuit 258 is configured to add the voltage variation ΔN2 to the digital data DHR(t−1), so as to retrieve the digital data DHR(t).

Figure 4:
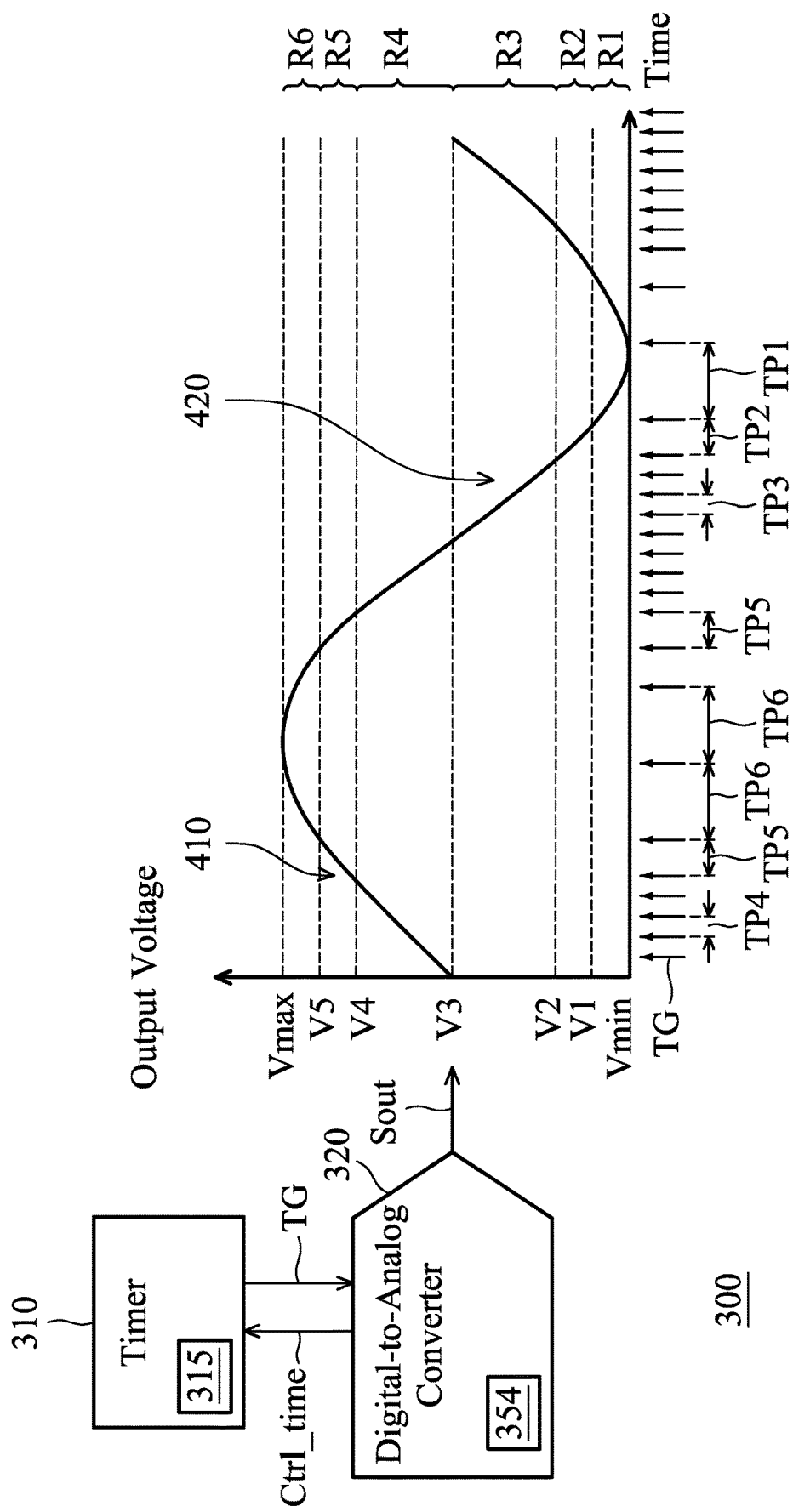
FIG. 4 shows a waveform generator according to some embodiments of the invention.

FIG. 4 shows a waveform generator 300 according to some embodiments of the invention. The waveform generator 300 includes a timer 310 and the DAC 320. The DAC 320 includes the data hold register 354, and the timer 310 includes a storage 315 for storing the time period variation. In response to the control signal Ctrl_time from the DAC 320, the timer 315 is configured to select one of the time periods TP1 through TP6, and to provide a trigger signal TG to the DAC 320 according to the selected time period. In response to the trigger signal TG, the DAC 320 is configured to read the digital data DHR(t) from the data hold register 354, and to convert the digital data DHR(t) into the output voltage of the analog signal Sout. In some embodiments, the data hold register 354 is a storage, a memory, or a general register. In addition, the digital data DHR(t) is obtained based on the digital data DHR(t−1) and the fixed voltage variation ΔNfix. The digital data DHR(t) represents the current digital data DHR, and the digital data DHR(t−1) represents the previous digital data DHR. Moreover, the voltage variation ΔNfix represents the fixed digital variation between the digital data DHR(t) and the digital data DHR (t−1).

In FIG. 4, the analog signal Sout is a sine wave. As described above, the output voltage of the analog signal Sout has a fixed waveform and a fixed frequency between the maximum voltage Vmax and the minimum voltage Vmin. Furthermore, the range from the minimum voltage Vmin to the maximum voltage Vmax is divided into 6 voltage ranges R1 through R6. The sizes of the voltage ranges R1 through R6 are determined according to actual applications (such as the characteristics of the analog signal Sout). In addition, in each of voltage ranges R1 through R6, the output voltage of the analog signal Sout rises or falls according to the fixed voltage variation ΔN.

In the waveform generator 300, in response to the rising or falling waveform of the analog signal Sout, the DAC 320 is configured to perform the addition or subtraction operation on the digital data DHR(t−1) according to the fixed voltage variation ΔNfix to obtain the digital data DHR(t). In addition, the DAC 320 is configured to provide the control signal Ctrl_time to the timer 310 according to the voltage range that corresponds to the output voltage of the analog signal Sout of the digital data DHR(t), such as the voltage range R1 through R6. Next, the timer 310 is configured to provide the trigger signal TG to the DAC 320 according to the time period that corresponds to the control signal Ctrl_time. Specifically, the DAC 320 is configured to provide the control signal Ctrl_time to the timer 310, so as to change the time when the timer 310 provides the next trigger signal TG.

In the same voltage range, the timer 310 is configured to provide the trigger signal TG according to the same time period. For example, when the control signal Ctrl_time indicates that the output voltage of the analog signal Sout that corresponds to the digital data DHR(t) is within the voltage range R2, the timer 310 is configured to periodically provide a trigger signal TG according to the time period TP2 that corresponds to the voltage range R2, until the control signal Ctrl_time indicates that the output voltage of the analog signal Sout is within another voltage range (e.g., the voltage range R1 or R3). Taking the rising waveform of the analog signal Sout (as shown in label 410) as an example, when the output voltage of the analog signal Sout is in the voltage range R4, the timer 310 is configured to provide the trigger signal TG according to the time period TP4 that corresponds to the voltage range R4. Next, when the output voltage of the analog signal Sout enters the voltage range R5 from the voltage range R4, the timer 310 is configured to provide the trigger signal TG according to the time period TP5 that corresponds to the voltage range R5. Next, when the output voltage of the analog signal Sout enters the voltage range R6 from the voltage range R5, the timer 310 is configured to provide the trigger signal TG according to the time period TP6 that corresponds to the voltage range R6. Moreover, taking the falling waveform of the analog signal Sout (as shown in label 420) as an example, when the output voltage of the analog signal Sout is in the voltage range R3, the timer 310 is configured to provide the trigger signal TG according to the time period TP3 that corresponds to the voltage range R3. Next, when the output voltage of the analog signal Sout enters the voltage range R2 from the voltage range R3, the timer 310 is configured to provide the trigger signal TG according to the time period TP2 that corresponds to the voltage range R2. Next, when the output voltage of the analog signal Sout enters the voltage range R1 from the voltage range R2, the timer 310 is configured to provide the trigger signal TG according to the time period TP1 that corresponds to the voltage range R1. In each of the voltage ranges R1 through R6, in response to each trigger signal TG, the DAC 320 is configured to generate the digital data DHR(t) according to the fixed voltage variation ΔNfix, so as to provide the output voltage of the analog signal Sout. The digital data DHR(t) is obtained according to the following formula:

$$DHR(t)=DHR(t-1)+\Delta Nfix$$

As described above, the digital data DHR(t) represents the current digital data DHR, and the digital data DHR(t−1) represents the previous digital data DHR.

In FIG. 4, the time period TP3 that corresponds to the voltage range R3 and the time period TP4 that corresponds to the voltage range R4 are the minimum time periods. In addition, the time period TP1 that corresponds to the voltage range R1 is the same as the time period TP6 that corresponds to the voltage range R6. The time period TP2 that corresponds to the voltage range R2 is the same as the time period TP5 that corresponds to the voltage range R5. In the timer 310, the storage 315 is configured to store the time period that corresponds to each voltage range. For example, the time periods TP1, TP2, TP3, TP4, TP5, and TP6 that correspond to the voltage ranges R1, R2, R3, R4, R5, and R6 are stored in the storage 315. Thus, the timer 310 is configured to obtain the corresponding time period from the time periods TP1 through TP6 of the storage 315 according to the control signal Ctrl_time. As described above, the time periods TP1 through TP6 and the voltage ranges R1 through R6 are determined according to the waveform characteristics of the analog signal Sout. Moreover, the time periods TP1 through TP6 can be modified by programming. In some embodiments, two adjacent voltage ranges correspond to different time periods. For example, the voltage range R2 is adjacent to the voltage range R3, and the time period TP2 that corresponds to the voltage range R2 is different from the time period TP3 that corresponds to the voltage range R3.

In some embodiments, the time periods TP5 and TP2 are greater than the time periods TP3 and TP4, and the time periods TP6 and TP1 are greater than the time periods TP5 and TP2. In other words, the time periods TP3 and TP4 are the minimum time periods, and the time periods TP6 and TP1 are the maximum time periods. Therefore, when the output voltage of the analog signal Sout is within the voltage ranges R3 and R4, the frequency (or number of times) of the timer 310 providing the trigger signal TG to the DAC 320 is relatively high. Conversely, when the output voltage of the analog signal Sout is within the voltage range R2 and R5 or the voltage range R1 and R6, the frequency (or number of times) of the trigger signal TG provided by the timer 310 to the DAC 320 is relatively low. Therefore, the number of times that the DAC 320 is triggered by the trigger signal TG to provide the output voltage of the analog signal Sout is reduced, thus reducing power consumption.

Figure 5:
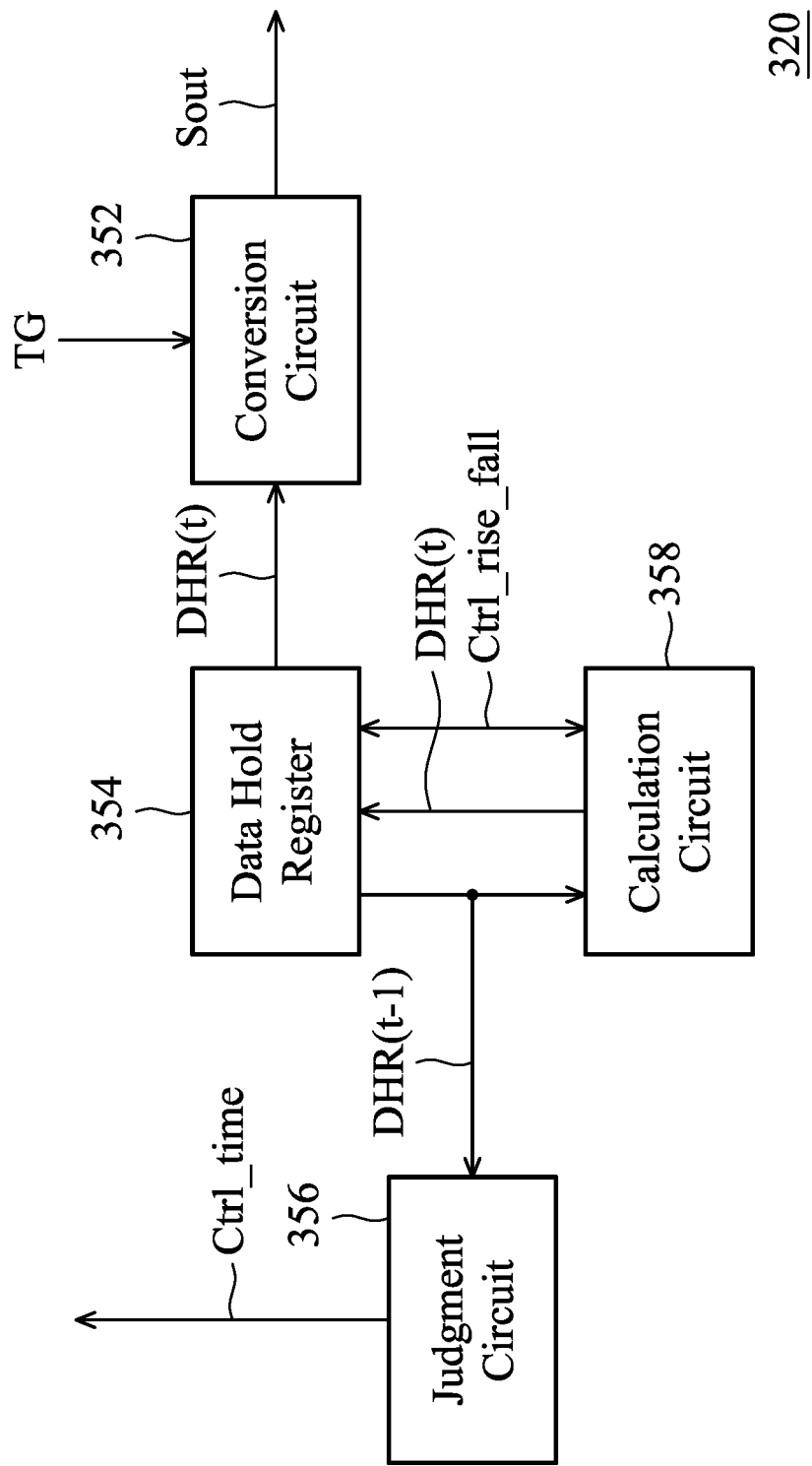
FIG. 5 shows the DAC according to some embodiments of the invention.

FIG. 5 shows the DAC 320 according to some embodiments of the invention. The DAC 320 includes a conversion circuit 352, the data hold register 354, a judgment circuit 356, and a calculation circuit 358. The data hold register 354 is configured to provide the digital data DHR(t−1) to the judgment circuit 356 and the calculation circuit 358. As described above, the digital data DHR(t−1) represents the previous digital data DHR. Next, the judgment circuit 356 is configured to provide the control signal Ctrl_time to the timer 310 in FIG. 4 according to the digital data DHR(t−1). The control signal Ctrl_time indicates in which voltage range the output voltage of the analog signal Sout that corresponds to the digital data DHR(t−1) is located, that is, the voltage range R1, R2, R3, R4, R5 or R6. As described above, the timer 310 is configured to obtain the corresponding time period from the storage 315 according to the control signal Ctrl_time, and to provide the trigger signal TG to the DAC 320 according to the obtained time period. The calculation circuit 358 is configured to obtain the digital data DHR(t) according to the digital data DHR(t−1) from the data hold register 354 and the control signal Ctrl_rise_fall, and to store the digital data DHR(t) in the data hold register 354. The control signal Ctrl_rise_fall indicates whether the analog signal Sout has a rising waveform or a falling waveform. Therefore, in the data hold register 354, the digital data DHR(t−1) is updated to the digital data DHR(t). In response to the trigger signal TG, the conversion circuit 352 converts the digital data DHR(t) from the data hold register 354 into the output voltage of the analog signal Sout. The conversion circuit 352 is a resistive digital-to-analog conversion circuit, a capacitive digital-to-analog conversion circuit, or a current-type digital-to-analog conversion circuit. In some embodiments, the data hold register 354, the judgment circuit 356, and the calculation circuit 358 are integrated in the same circuit.

In some embodiments, after receiving the control signal Ctrl_rise_fall, the calculation circuit 358 is configured to perform the addition or subtraction operation on the digital data DHR(t−1) according to the fixed voltage variation ΔNfix. For example, when the control signal Ctrl_rise_fall indicates that the analog signal Sout has a rising waveform, the calculation circuit 358 is configured to add the fixed voltage variation ΔNfix to the digital data DHR(t−1) to obtain the digital data DHR(t). Conversely, when the control signal Ctrl_rise_fall indicates that the analog signal Sout has a falling waveform, the calculation circuit 358 is configured to subtract the voltage variation ΔNfix from the digital data DHR(t−1) to obtain the digital data DHR(t).

After obtaining the digital data DHR(t), the calculation circuit 358 is configured to determine whether the digital data DHR(t) is greater than the maximum digital data DHRmax that corresponds to the maximum voltage Vmax or less than the minimum digital data DHRmin that corresponds to the minimum voltage Vmin. As described above, when the digital data DHR(t) is greater than the maximum digital data DHRmax or less than the minimum digital data DHRmin, the calculation circuit 358 is configured to change the state of the control signal Ctrl_rise_fall, and to store the changed state of the control signal Ctrl_rise_fall in the data hold register 354. Next, similar to the calculation circuit 258 of FIG. 3, the calculation circuit 358 is configured to retrieve the digital data DHR(t) according to the changed control signal Ctrl_rise_fall.

Compared with the waveform generator 100 of FIG. 1 or the waveform generator that can only generate the triangle waves, the waveform generator 300 does not need to use direct memory access (DMA) technology to read the waveform data DAT from the memory. Therefore, in the electronic system with the waveform generator 300, the bandwidth of the DMA transmission is not occupied in the process of generating the analog signal Sout, thereby decreasing the power consumption of the electronic system. Moreover, in a part of the voltage ranges, since the time period is longer (i.e., the frequency of providing the trigger signal TG is smaller), the frequency of generating the analog signal Sout is also be lower, thereby decreasing power consumption.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A waveform generator, comprising:
   a timer configured to periodically provide a trigger signal according to a fixed time period; and
   a digital to analog converter (DAC) configured to convert first digital data into an output voltage of an analog signal in response to the trigger signal, wherein the analog signal has a fixed waveform and a fixed frequency between a maximum voltage and a minimum voltage, and a range between the maximum voltage and the minimum voltage is divided into a plurality of voltage ranges,
   wherein the DAC comprises:
      a data hold register configured to store second digital data that corresponds to a previous output voltage of the analog signal;
      a judgment circuit configured to provide a first control signal according to the second digital data, wherein the first control signal indicates that the previous output voltage is within a first voltage range of the voltage ranges; and
      a calculation circuit configured to obtain the first digital data according to a second control signal, the second digital data, and a voltage variation that corresponds to the first voltage range, and store the first digital data in the data hold register to update the second digital data,
   wherein the second control signal indicates whether the analog signal has a rising waveform or a falling waveform.

2. The waveform generator as claimed in claim 1, wherein when the second control signal indicates that the analog signal has a rising waveform, the calculation circuit is configured to add the voltage variation that corresponds to the first voltage range to the second digital data, so as to obtain the first digital data.

3. The waveform generator as claimed in claim 1, wherein when the second control signal indicates that the analog signal has the falling waveform, the calculation circuit is configured to subtract the voltage variation that corresponds to the first voltage range from the second digital data, so as to obtain the first digital data.

4. The waveform generator as claimed in claim 1, wherein in each of the voltage ranges, the output voltage of the analog signal is increased or decreased by the same voltage variation.

5. The waveform generator as claimed in claim 1, wherein when the second control signal indicates that the analog signal has the rising waveform and the first digital data is greater than a maximum digital data that corresponds to the maximum voltage, the DAC is configured to change the second control signal to indicate that the analog signal has the falling waveform, and the calculation circuit is configured to subtract the voltage variation that corresponds to the first voltage range from the second digital data, so as to obtain the first digital data again.

6. The waveform generator as claimed in claim 1, wherein when the second control signal indicates that the analog signal has the falling waveform and the first digital data is less than a minimum digital data that corresponds to the minimum voltage, the DAC is configured to change the second control signal to indicate that the analog signal has the rising waveform, and the calculation circuit is configured to add the voltage variation that corresponds to the first voltage range to the second digital data, so as to obtain the first digital data again.

7. The waveform generator as claimed in claim 1, wherein when the first voltage range comprises an intermediate voltage between the maximum voltage and the minimum voltage, the voltage variation is a maximum voltage variation, and when the first voltage range comprises the maximum voltage or the minimum voltage, the voltage variation is a minimum voltage variation.

8. The waveform generator as claimed in claim 1, wherein the first voltage range and a second voltage range adjacent to the first voltage range correspond to different voltage variations.

9. A waveform generator, comprising:
a timer configured to provide a trigger signal according to a variable time period; and
a digital to analog converter (DAC) configured to convert first digital data into an output voltage of an analog signal in response to the trigger signal, wherein the analog signal has a fixed waveform and a fixed frequency between a maximum voltage and a minimum voltage, and a range between the maximum voltage and the minimum voltage is divided into a plurality of voltage ranges,
wherein the DAC comprises:
a data hold register configured to store second digital data;
a judgment circuit configured to provide a first control signal according to a previous output voltage of the analog signal that corresponds to the second digital data, wherein the first control signal indicates that the previous output voltage is within a first voltage range of the voltage ranges; and
a calculation circuit configured to obtain the first digital data according to a second control signal, the second digital data, and a fixed voltage variation, and store the first digital data in the data hold register to update the second digital data,
wherein the second control signal indicates whether the analog signal has a rising waveform or a falling waveform.

10. The waveform generator as claimed in claim 9, wherein when the second control signal indicates that the analog signal has the rising waveform, the calculation circuit is configured to add the fixed voltage variation to the second digital data, so as to obtain the first digital data.

11. The waveform generator as claimed in claim 9, wherein when the second control signal indicates that the analog signal has the falling waveform, the calculation circuit is configured to subtract the fixed voltage variation from the second digital data, so as to obtain the first digital data.

12. The waveform generator as claimed in claim 9, wherein in each of the voltage ranges, the timer is configured to periodically provide the trigger signal with the same time period.

13. The waveform generator as claimed in claim 9, wherein when the second control signal indicates that the analog signal has the rising waveform and the first digital data is greater than a maximum digital data that corresponds to the maximum voltage, the DAC is configured to change the second control signal to indicate that the analog signal has the falling waveform, and the calculation circuit is configured to subtract the fixed voltage variation from the second digital data, so as to obtain the first digital data again.

14. The waveform generator as claimed in claim 9, wherein when the second control signal indicates that the analog signal has the falling waveform and the first digital data is less than a minimum digital data that corresponds to the minimum voltage, the DAC is configured to change the second control signal to indicate that the analog signal has the rising waveform, and the calculation circuit is configured to add the fixed voltage variation to the second digital data, so as to obtain the first digital data again.

15. The waveform generator as claimed in claim 9, wherein when the first voltage range comprises an intermediate voltage between the maximum voltage and the minimum voltage, the variable time period is a minimum time period, and when the first voltage range comprises the maximum voltage or the minimum voltage, the variable time period is a maximum time period.

16. The waveform generator as claimed in claim 9, wherein the first voltage range and a second voltage range adjacent to the first voltage range correspond to different time periods.

17. A waveform generating method, comprising:
periodically providing a trigger signal according to a fixed time period;
in response to the trigger signal, converting first digital data into an output voltage of an analog signal, wherein the analog signal has a fixed waveform and a fixed frequency between a maximum voltage and a minimum voltage, and a range between the maximum voltage and the minimum voltage is divided into a plurality of voltage ranges;
providing a first control signal according to a previous output voltage of the analog signal that corresponds to second digital data, wherein the first control signal indicates that the previous output voltage is within a first voltage range of the voltage ranges;
obtaining the first digital data according to a second control signal, the second digital data, and a voltage variation that corresponds to the first voltage range; and
updating the second digital data according to the first digital data,
wherein the second control signal indicates whether the analog signal has a rising waveform or a falling waveform.

18. The waveform generating method as claimed in claim 17, wherein the step of obtaining the first digital data according to the second control signal, the second digital data, and the voltage variation that corresponds to the first voltage range further comprises:
when the second control signal indicates that the analog signal has the rising waveform, adding the voltage variation that corresponds to the first voltage range to the second digital data, so as to obtain the first digital data; and
when the second control signal indicates that the analog signal has the falling waveform, subtracting the voltage variation that corresponds to the first voltage range from the second digital data, so as to obtain the first digital data.

19. The waveform generating method as claimed in claim 17, wherein in each of the voltage ranges, the output voltage of the analog signal is increased or decreased by the same voltage variation.

20. The waveform generating method as claimed in claim 17, wherein when the first voltage range comprises an intermediate voltage between the maximum voltage and the minimum voltage, the voltage variation is a maximum voltage variation, and when the first voltage range comprises the maximum voltage or the minimum voltage, the voltage variation is a minimum voltage variation.

* * * * *